(12) United States Patent
Gregorian et al.

(10) Patent No.: US 6,351,165 B1
(45) Date of Patent: Feb. 26, 2002

(54) DIGITAL JITTER ATTENUATOR USING AN ACCUMULATED COUNT OF PHASE DIFFERENCES

(75) Inventors: Roubik Gregorian, Saratoga; Shih-Chung Fan, Fremont, both of CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/644,526

(22) Filed: Aug. 21, 2000

(51) Int. Cl.$^7$ .................................................. H03L 7/06
(52) U.S. Cl. ...................................... 327/156; 327/160
(58) Field of Search ................................ 327/155, 156, 327/159, 160, 161; 375/376; 331/DIG. 2

(56) References Cited

U.S. PATENT DOCUMENTS

| | | | |
|---|---|---|---|
| 4,617,679 A | * 10/1986 | Brooks | 327/159 |
| 4,941,156 A | 7/1990 | Stern et al. | 375/372 |
| 5,012,198 A | * 4/1991 | Okada et al. | 327/160 |
| 5,162,746 A | 11/1992 | Ghoshal | 327/159 |
| 5,173,617 A | * 12/1992 | Alsup et al. | 327/160 |
| 5,493,243 A | 2/1996 | Ghoshal | 327/158 |
| 5,502,750 A | 3/1996 | Co et al. | 375/372 |
| 5,602,882 A | 2/1997 | Co et al. | 375/372 |
| 5,644,605 A | 7/1997 | Whiteside | 375/375 |
| 5,687,202 A | * 11/1997 | Eitrheim | 327/160 |
| 5,764,709 A | 6/1998 | Whiteside | 375/375 |
| 6,137,325 A | * 10/2000 | Miller et al. | 327/160 |

\* cited by examiner

*Primary Examiner*—Kenneth B. Wells
(74) *Attorney, Agent, or Firm*—Townsend and Townsend and Crew LLP

(57) ABSTRACT

A phase detector which detects the phase difference between the input clock and an output clock. That phase difference is used to gate a high frequency clock, which is provided to the clock input of an up/down counter. The phase detector also indicates whether the phase difference is positive or negative. When the counter reaches a pre-specified up or down count, an advance or retard signal is provided to a phase selector. The phase selector selects one of multiple phases of a clock used for the output clock.

9 Claims, 2 Drawing Sheets

DIGITAL JITTER ATTENUATOR USING AN ACCUMULATED COUNT OF PHASE DIFFERENCES

BACKGROUND OF THE INVENTION

The present invention relates to jitter attenuators.

Jitter attenuators are used to compensate for phase variations in an input signal. Uncompensated jitter can be a significant source of error. In transmission systems such as T1 and E1, the clock is encoded with the data. A receiver will extract the clock from the coded datastream and provide the extracted clock and data itself. This clock can then be used to retransmit the data to the next node. Jitter is obviously undesirable since any phase variation of the clock can be passed along from node to node.

There are many causes of jitter. For example, the transmission media may transmit higher frequency portions of the signal faster than lower frequency portions.

Typically, the received clock is filtered and smoothed to remove the jitter. An elastic buffer, such as a FIFO, is sometimes used to buffer the difference in rates of the received jittery clock and the retransmitted data. See, for example, U.S. Pat. No. 5,090,025.

Another example of a jitter attenuator is shown in U.S. Pat. No. 5,495,243. This patent shows using an up/down counter and a subsequent decoder to control the digital frequency synthesizer. The input clock is used to decrement the counter, while the output, divided-down clock is used to increment the counter. Each change in the count causes a change in the phase of the synthesized frequency.

It would be desirable to have a digital jitter attenuator which corrects for jitter, but which corrects slowly enough to avoid tracking phase variations which are transient.

SUMMARY OF THE INVENTION

The present invention provides a phase detector which detects the phase difference between the input clock and an output clock. That phase difference is used to gate a high frequency clock, which is provided to the clock input of an up/down counter. The phase detector also indicates whether the phase difference is positive or negative. When the counter reaches a pre-specified up or down count, an advance or retard signal is provided to a phase selector. The phase selector selects one of multiple phases of a clock used for the output clock.

To the extent jitter is self-offsetting, or corrects it on the next or a close pulse, the present invention will not change the output phase. For example, a positive count may be offset by a subsequent negative count. It is only when the total count reaches a preselected number that the output clock phase is adjusted. This ensures that the phase jitter is not transient. However, the count is selected low enough so that true jitter is compensated for sufficiently quickly.

In a preferred embodiment, the invention uses a multiple phase clock generator. One of the clock phases generated is selected by a phase selector connected to the output of the up/down counter. The selected clock is then divided down to the frequency of the input clock. The same high frequency clock used to generate the multiple phases is also used for the input phase detector.

For a further understanding of the nature and advantages of the invention, reference should be made to the following description taken in conjunction with the accompanying drawings.

DESCRIPTION OF THE SPECIFIC EMBODIMENTS

Figure 1:
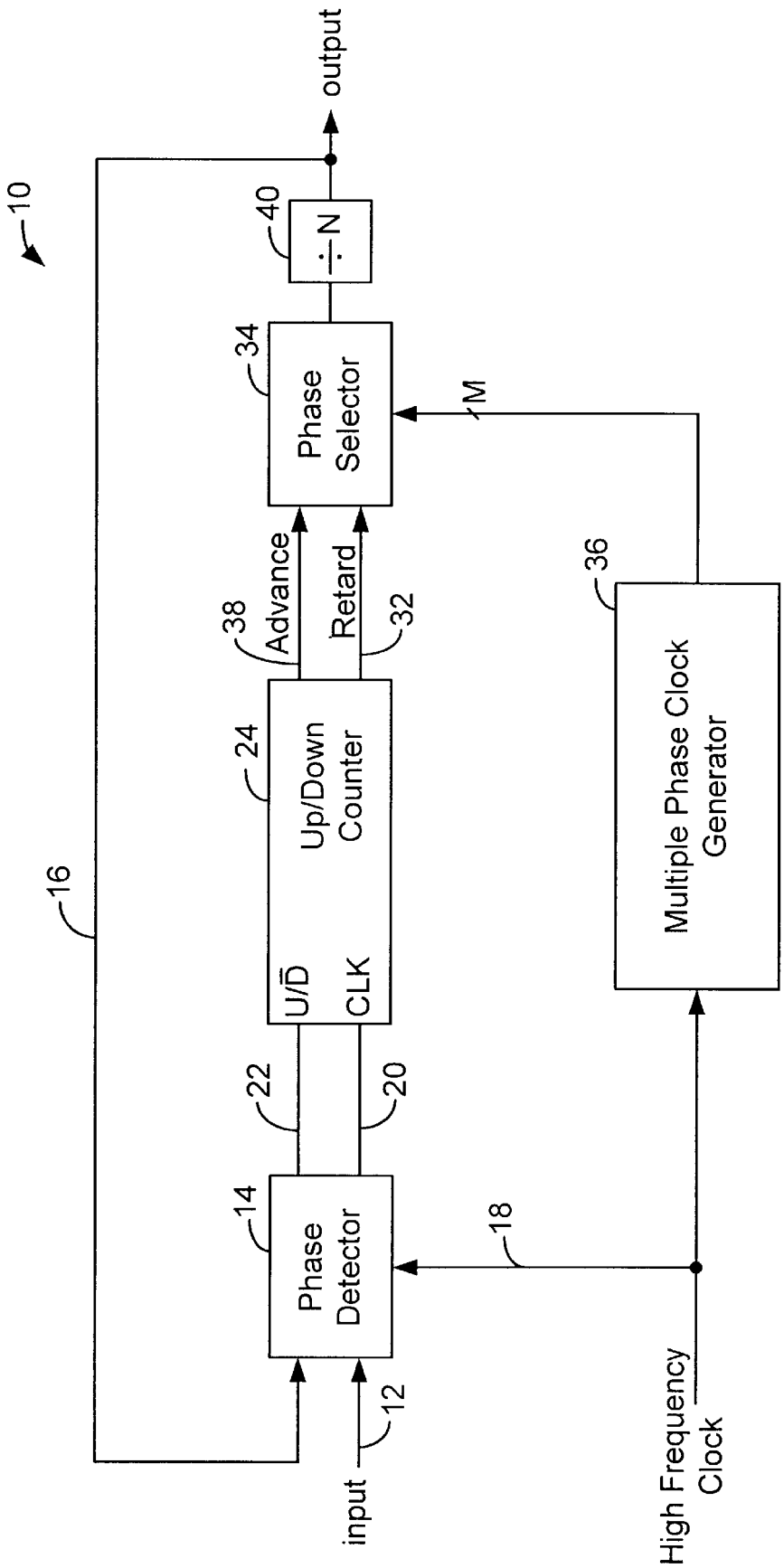
FIG. 1 is a block diagram of an embodiment of the present invention.

FIG. 1 shows a jitter attenuator circuit 10 according to an embodiment of the invention. An input on a line 12 is provided to a phase detector 14. The input on line 12 may be a T1, E1, or other communication signal. In one embodiment, the present invention could be used in a transceiver, such as a T1/E1 transceiver. A second input to phase detector 14 on line 16 is an output clock signal after jitter correction. This is fed back from the output of the circuit of FIG. 1.

A high frequency clock signal is provided on a line 18. The high frequency clock is preferably selected to have a frequency which is a multiple of the input frequency used.

Figure 2:
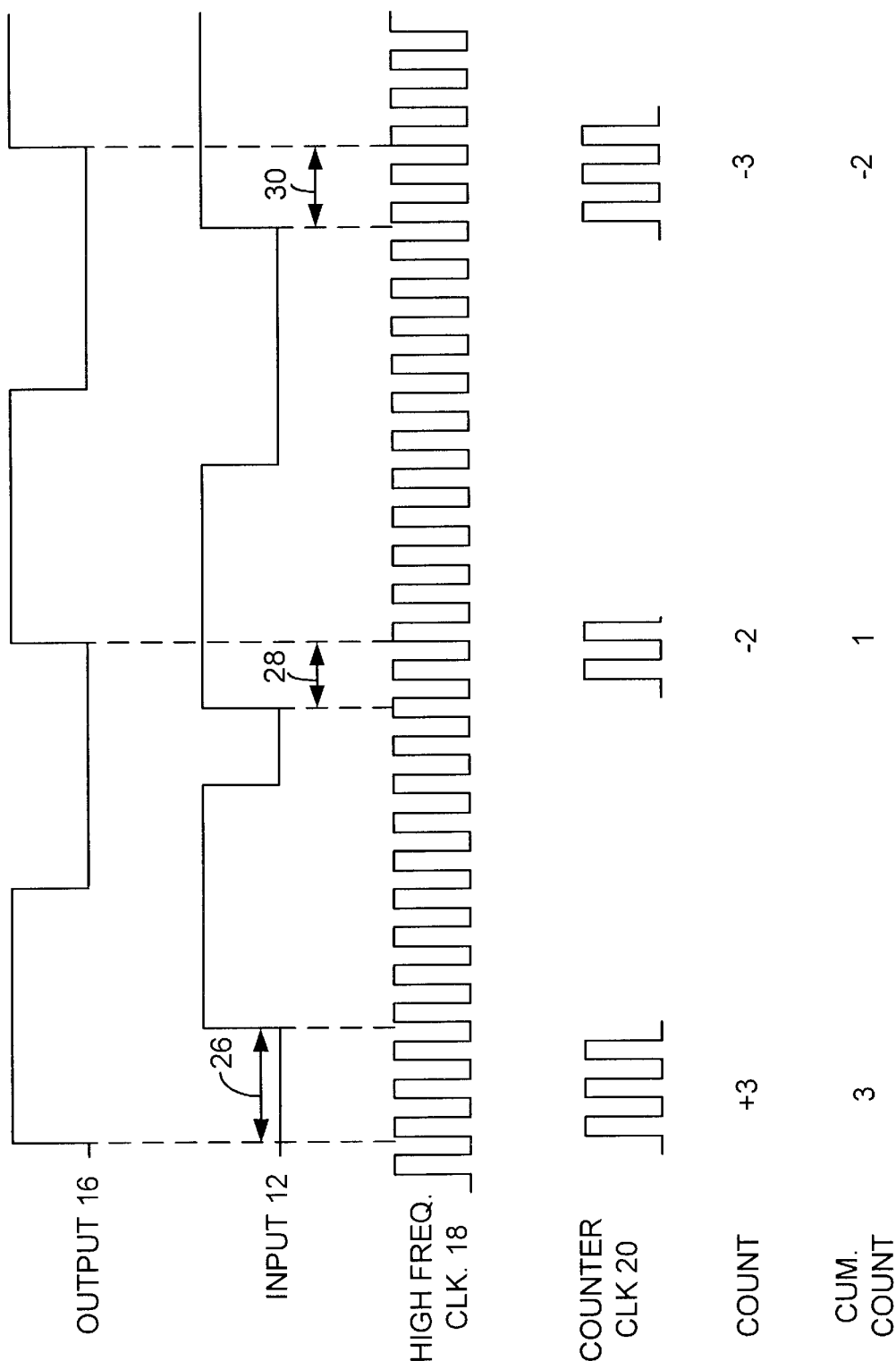
FIG. 2 is a timing diagram illustrating the operation of the embodiment of FIG. 1.

The phase detector provides a clock signal output on a line 20 and an up/down signal on a line 22 to an up/down counter 24. An example of the operation is illustrated by the signals in FIG. 2. The signals shown are the output clock 16 and input clock 12. Also shown is the high frequency clock 18. The phase detector detects the difference between the rising edges of the clocks on lines 12 and 16. This difference is indicated by arrows 26. This performs a gating of the high frequency clock 18, allowing three pulses in the example shown to be gated through to output line 20, the clock input of the up/down counter. Thus, as indicated below in FIG. 2, a +3 count will be provided to increment up/down counter 24, given a cumulative count of 3.

A subsequent difference in rising edges is shown by arrows 28. Here, the difference is negative, since the rising edge of the clock on the input line 12 is ahead of the output clock on line 16. As shown, two clock pulses of the high frequency clock are gated through. A negative value is applied to the up/down input on line 22 to up/down counter 24. Thus, a count of −2 is provided to the counter. This gives a cumulative count of 1.

Subsequently, as shown by arrows 30, the phase difference continues to be negative, by an amount of 3. The cumulative count will now be −2. If this continues, this shows a jitter which is not transient. Once the negative value reaches a predetermined value, such as, for example, negative 10, a retard signal can be provided on an output line 32 of up/down counter 24 to phase selector 34 as shown in FIG. 1. This will cause the phase selector to select a phase of the output clock which is retarded from that shown as output 16 in FIG. 2. This should close the phase difference gap.

The phase selector selects one of multiple phases of a clock signal from a multiple phase clock signal generator 36. As shown, M outputs of clock generator 36 are provided to phase selector 34. In one embodiment of the invention, M is 4. Clock generator 36 receives its input from the same high frequency clock line 18 that is provided to phase detector 14. The high frequency clock in one embodiment is 32 times the frequency of the input clock.

If the phase difference were to be positive, an advance signal would be output from up/down counter 24 on a line 38 to phase selector 34. The output of phase selector 34 is provided to a divide by N frequency divider 40, which divides the high frequency clock down to the same frequency as the input clock on line 12.

Upon the generation of an advance or retard signal, up/down counter 24 is configured to automatically reset itself to its original count. This may be a count of zero, for example.

An advantage of the invention is that the circuit can be designed and analyzed in the Z domain using a DSP (Digital Signal Processing) approach.

In one embodiment, phase selector 34 can be a multiplexer for multiplexing the various M phases of the clock, with logic selection circuitry controlled by the advance and retard signals on lines 32 and 38. In one embodiment, each advance or retard signal selects the next phase clock. Phase detector 14 can be constructed using a pair of flip-flops with appropriate logic for indicating which rising edge is ahead for providing the up/down input to up/down counter 24. Alternately, other logic may be used as would be apparent to one of skill in the art.

As will be understood by those of skill in the art, the present invention may be embodied in other specific forms without departing from the essential characteristics thereof. For example, the phase selector could select the multiple phases of a clock signal after they have been frequency-divided, rather than before. The specific count used for the up/down counter could be varied depending upon the application. Alternately, instead of selecting the next phase from the multiple phase clock generator, one or more phases could be skipped, such as where the count is reached very quickly, indicating a larger correction is required. Accordingly, the foregoing description is intended to be illustrative, but not limiting, of the scope of the invention which is set forth in the following claims.

What is claimed is:

1. A digital jitter attenuator circuit comprising:
   a phase detector having a first input coupled to an input line for receiving an input signal, and a second input coupled to an output line;
   an up/down counter coupled to said phase detector, said up/down counter being programmed to produce an output only after a pre-specified multiple count is reached;
   a phase selector coupled to an output of said up/down counter to select one of multiple phases of a clock having a higher frequency than said input signal;
   a divider coupled to an output of said phase selector, an output of said divider being said output line; and
   wherein an output of said phase detector enables said clock as a clock input to said up/down counter, and an up/down input to said up/down counter is controlled by the value of said output of said phase detector.

2. The circuit of claim 1 further comprising:
   a multiple phase clock generator having M outputs connected as inputs to said phase selector.

3. The circuit of claim 1 wherein said up/down counter is configured to produce both advance and retard output signals for advancing or retarding the phase of an output signal on said output line.

4. The circuit of claim 3 wherein said up/down counter is configured to reset after outputting one of said advance and retard output signals.

5. A digital jitter attenuator circuit comprising:
   a phase detector having a first input coupled to an input line, and a second input coupled to an output line;
   an up/down counter coupled to said phase detector, said up/down counter being programmed to produce an output only after a pre-specified multiple count is reached;
   a phase selector coupled to an output of said up/down counter;
   a multiple phase clock generator having M outputs of phases of a clock connected as inputs to said phase selector;
   a divider coupled to an output of said phase selector, an output of said phase selector being said output line;
   wherein an output of said phase detector enables said clock as a clock input to said up/down counter, and an up/down input to said up/down counter is controlled by the value of said output of said phase detector; and
   wherein said up/down counter is configured to produce both advance and retard output signals for advancing or retarding the phase of an output signal on said output line, and to reset after outputting one of said advance and retard output signals.

6. A method for digitally attenuating jitter comprising:
   enabling a clock with a phase difference between an input signal and an output signal;
   counting up a number of edges of said clock during a first phase difference of said input and output signals, and counting down a number of edges of said clock during a second phase difference of said input and output signal;
   providing an advance/retard signal when a predetermined count is reached; and
   selecting a phase of said clock in response to said advance/retard signal.

7. The method of claim 6 farther comprising:
   providing M multiple phase clocks for said selecting.

8. The method of claim 6 further comprising dividing down a selected one of said multiple phase clocks.

9. The method of claim 6 further comprising resetting a counter after providing said advance/retard signal.

* * * * *